(12) United States Patent
McElroy et al.

(10) Patent No.: US 6,756,576 B1
(45) Date of Patent: Jun. 29, 2004

(54) IMAGING SYSTEM HAVING REDUNDANT PIXEL GROUPINGS

(75) Inventors: David J. McElroy, Livingston, TX (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 09/650,551

(22) Filed: Aug. 30, 2000

(51) Int. Cl.⁷ .............................................. H01L 27/00
(52) U.S. Cl. ................................ 250/208.1; 250/214 A
(58) Field of Search ......................... 250/208.1, 208.2, 250/214 A, 214 AG, 226; 348/246

(56) References Cited

U.S. PATENT DOCUMENTS

| | | | | |
|---|---|---|---|---|
| 3,906,389 A | * | 9/1975 | Matsumoto et al. .......... | 330/59 |
| 5,291,293 A | * | 3/1994 | Kapan ......................... | 348/246 |
| 5,635,700 A | * | 6/1997 | Fazekas ..................... | 250/208.2 |
| 5,854,655 A | | 12/1998 | Watanabe et al. ........... | 348/247 |
| 6,133,563 A | * | 10/2000 | Clark et al. .............. | 250/208.1 |
| 6,184,752 B1 | * | 2/2001 | Dautriche ............... | 250/214 A |
| 6,201,234 B1 | * | 3/2001 | Chow et al. .......... | 250/214 LS |
| 6,219,468 B1 | * | 4/2001 | Yukawa et al. ............. | 382/312 |
| RE37,282 E | * | 7/2001 | Smitt .......................... | 358/474 |

OTHER PUBLICATIONS

Fossum, E.R., "CMOS Image Sensors: Electronic Camera On A Chip", *IEDM*, pp 17–24, (1995).

Fossum, E.R., "CMOS Image Sensors: Electronic Camera–On–A–Chip", *IEEE Transactions on Electron Devices*, 44(*10*), pp. 1689–1698, (Oct. 1997).

Iida, Y., et al., "Study of Pixel Structure and Layout for CMOS Active Pixel Image Sensor", *SPIE, 3301*, pp. 158–167, (1998).

* cited by examiner

*Primary Examiner*—Thanh X. Luu
(74) *Attorney, Agent, or Firm*—Schwegman, Lundberg, Woessner & Kluth, P.A.

(57) ABSTRACT

Imaging arrays are electronic devices that sense light and output electrical signals representative of the sensed light. An imaging array comprises thousands or millions of photodetectors that convert sensed light into corresponding electric signals, which are ultimately converted into digital image signals for recording or viewing. One problem with conventional imaging arrays concerns defective or malfunctioning photodetectors. Defective photodetectors typically result in erroneous image signals that ultimately degrade the quality of resulting images. Accordingly, the present inventors devised new imaging arrays including redundant photodetectors to compensate for defective photodetectors. One exemplary embodiment includes one or more photodetectors that are substantially smaller than conventional photodetectors, for example about 10 or 25 square microns. The smaller-than-conventional photodetectors are arranged into two or more groups, with each group having two or more photodetectors coupled to produce a single group image signal. If the group image signal for a group falls below some threshold level indicative of a defective or malfunctioning photodetector, the group image signal is amplified to compensate for the loss.

21 Claims, 3 Drawing Sheets

IMAGING SYSTEM HAVING REDUNDANT PIXEL GROUPINGS

TECHNICAL FIELD

The present invention concerns imaging arrays and methods, particularly methods for correcting or compensating for defective or malfunctioning photodetectors in an imaging array.

BACKGROUND OF THE INVENTION

Imaging arrays are electronic devices that sense light and output electrical signals representative of the sensed light. The imaging arrays are generally coupled to a television screen, computer monitor, or digital camera, which displays or records an image based on the output electrical signals.

An imaging array often includes a rectangular array or matrix of thousands or even millions of photodetectors, with each photodetector having a unique row and column position within the array which corresponds to a particular region, known as a pixel, of a displayed image. Each photodetector (or sensor pixel) converts sensed light into corresponding electric signals based on the intensity of the light. The electrical signals are converted into digital signals, comprising ones and zeros, which are processed by a digital-signal-processing circuit. This circuit ultimately outputs image signals to a device for recording or viewing.

One problem with conventional imaging arrays concerns defective or malfunctioning photodetectors. Defective photodetectors typically result in erroneous image signals that ultimately degrade the quality of resulting images. For example, an image based on imaging signals from an imaging array having a defective photodetector can have a black or dark area at the image region corresponding to the defective photodetector.

One limited solution to this problem has been to identify the defective photodetector and to generate a substitute image signal for the image signal of the defective photodetector, with the substitute image signal based on an average of the image signals from detectors surrounding it. See, for example, U.S. Pat. No. 5,854,655 (which is incorporated herein by reference). However, this solution suffers from the disadvantage that the substitute image signal introduces artifacts into the resulting image. The artifacts reflect the complete loss of information about the light actually striking the relatively large area corresponding to the defective photodetector.

Accordingly, there is a need for other methods of handling defective photodetectors.

SUMMARY OF INVENTION

To address this and other problems, the present inventor devised new imaging arrays and related methods for compensating for defective photodetectors. One exemplary embodiment of a new imaging array includes two or more group photodetectors, or "group pixels," with each group pixel having two or more photodetectors coupled to produce a single group image signal. If the group image signal for a group pixel falls below some threshold level indicative of a defective or malfunctioning photodetector, the group image signal is amplified to compensate for the loss.

Various embodiments implement the photodetectors as passive or active photodiode circuits, as photogate circuits, as logarithmic sensor pixel circuits, or as charge-modulation devices. Some embodiments also implement the photodetectors as smaller-than-conventional photodetectors, that is, photodetectors having photo-sensing elements smaller than conventional elements.

DESCRIPTION OF THE PREFERRED EMBODIMENTS

Figure 1:
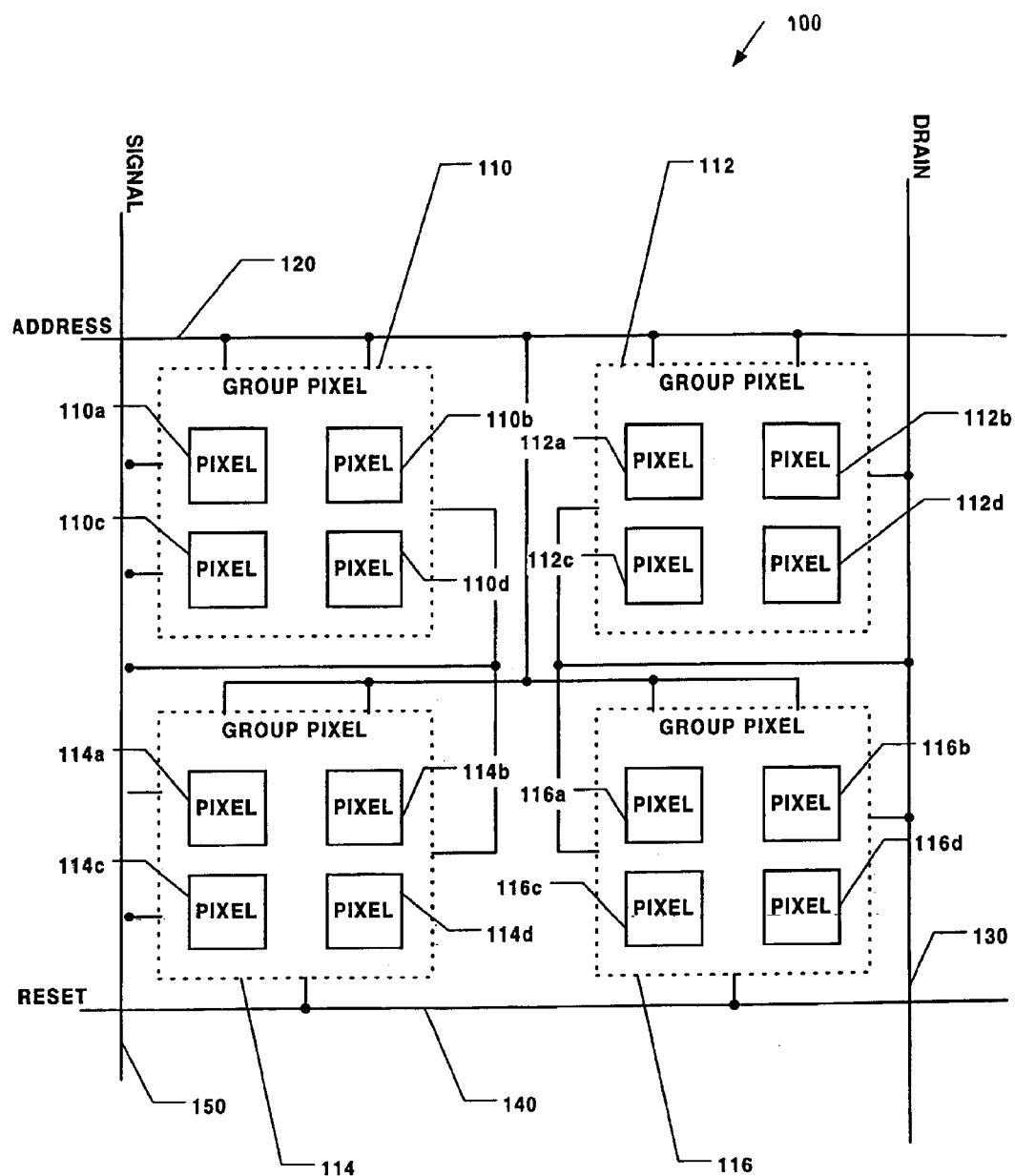
FIG. 1 is a block diagram of an exemplary imaging array 100 incorporating the invention.
Figure 2:
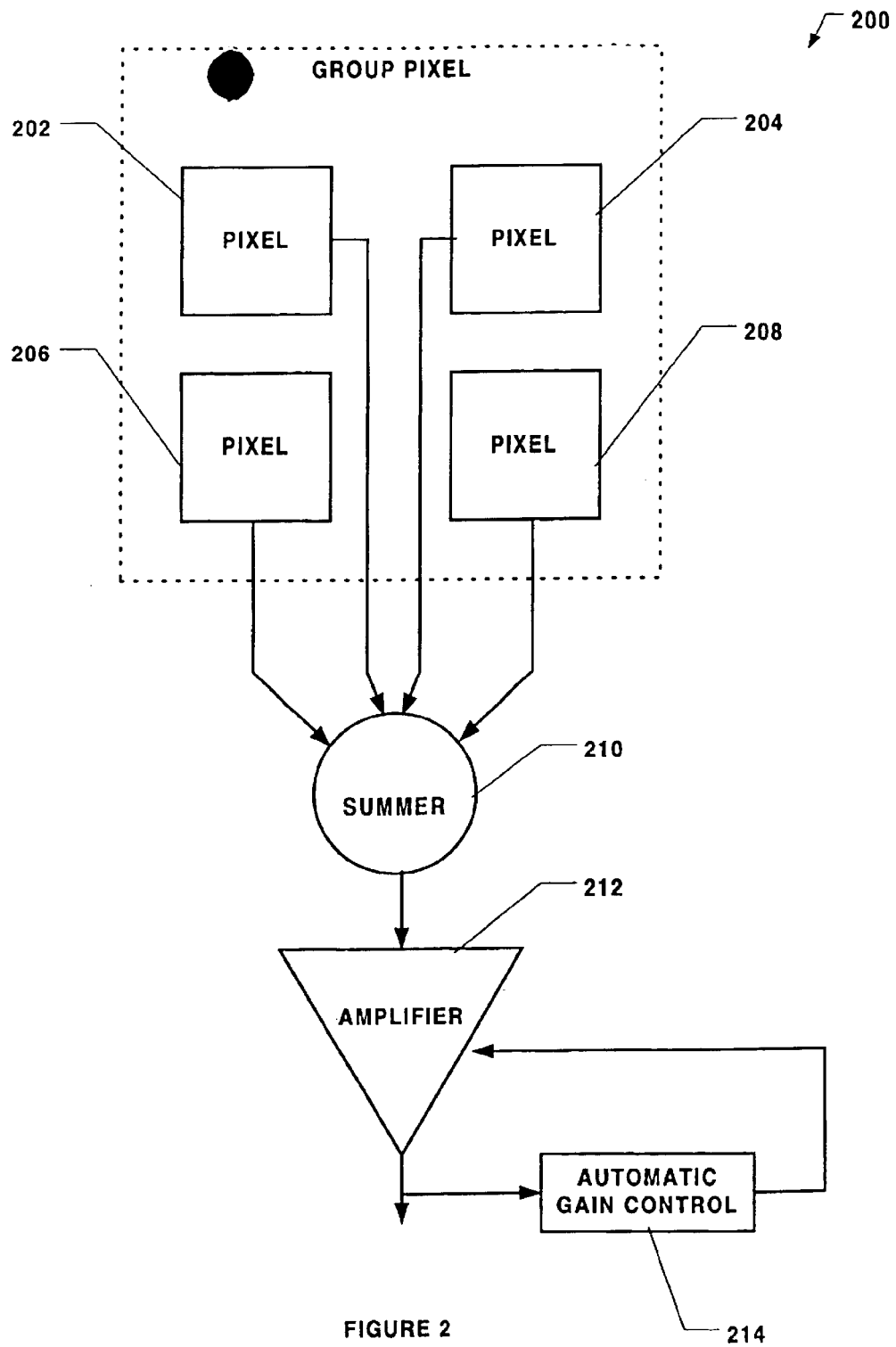
FIG. 2 is a block diagram of an exemplary group-pixel circuit 200 incorporating the present invention.
Figure 3:
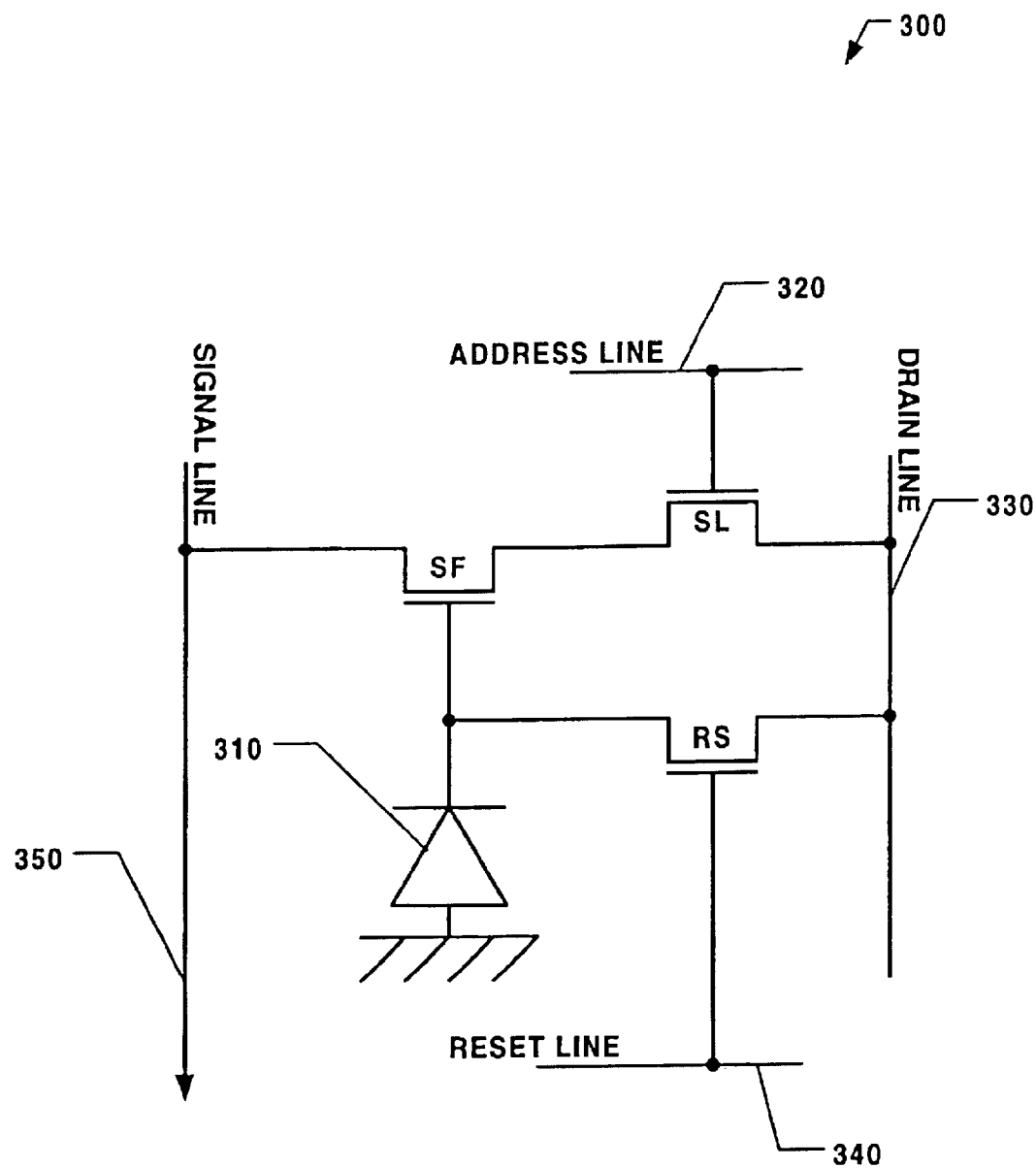
FIG. 3 is a block diagram of an exemplary pixel circuit 300.

The following detailed description, which references and incorporates FIGS. 1–3, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

FIG. 1 shows an exemplary imaging array 100 incorporating teachings of the present invention. Imaging array 100 includes group pixels 110, 112, 114, and 116, an address line 120, a drain Line 130, a reset line 140, and a signal line 150 for controlling the group pixels. (or clarity, the figure omits conventional features, such as row-select logic, column-select logic, timing-and-control circuitry, and analog-to-digital converters.) In the exemplary embodiment, array 100 includes four group pixels; however, other embodiments include 256×256 arrays, 512×512 arrays, 1024×1024 arrays. Still larger arrays are also within the scope of the invention.

Each of group pixels 110–116 includes two or more photodetectors, or sensor pixels. Group pixel 110 includes sensor pixels 110a, 110b, 110c, and 110d, and group pixels 112, 114, and 116 include respective sensor pixels 112a–112d, 114a–114d, and 116a–116d. Lines 120, 130, and 140, in the exemplary embodiment, control the group pixel in accord with known techniques for addressing and controlling conventional sensor pixels in imaging arrays. In some embodiments, each group pixels provides a particular output color, such as red, blue, or green.

FIG. 2 shows a block diagram of an exemplary group-pixel circuit 200 applicable to each of group pixels 110–116 in FIG. 1. Circuit 200 includes N sensor pixels, of which sensor pixels 202, 204, 206, and 208 are representative, a summer 210, a variable-gain amplifier 212, and an automatic gain controller 214. The N pixels 202–206, which operate according to known principles, are coupled to an input of summer 208, either through direct connection or through a multiplexer (not shown). Some embodiments include one or more analog-to-digital converters coupled between the signal lines of the pixels and the summer, depending on whether summer 210 is analog or digital.

Summer 210 aggregates the N responses of the N pixels 202–206 and outputs a first aggregate or group image signal to amplifier 212. (Some embodiments include in analog-to-digital converter between the summer and the amplifier.) Amplifier 212, which in some embodiments is analog and in others is digital, amplifies or scales the first group image signal and outputs a second group image signal to automatic gain controller 214 as well as to conventional imaging processing and display circuitry (not shown.) See U.S. Pat. No. 5,854,655, which is incorporated herein by reference.

Automatic gain controller 214, which is analog or digital, compares the second group image signal to an analog or digital reference current or voltage. If the comparison indicates that the second group image signal differs from the reference, controller 212 proportionately changes, that is, increases or decreases, the gain of amplifier 210, assuming that one or more of the N pixels or related interconnective circuitry is faulty. In the exemplary embodiment, gain controller 214 sets the gain to a factor proportional to the ratio of N, the number of pixels comprising the group pixel to M, the number of correctly operating or non-faulty pixels in the group pixel.

To determine the number of non-faulty pixels, some embodiments, check the performance of each pixel in each group pixel as a start-up diagnostic test and maintain a record of the number of faulty or non-faulty pixels in each group pixel. Other embodiments dynamically or periodically determine a difference between the first aggregate image signal and a reference, and then determine from the difference how many pixels are faulty. The reference in some embodiments is based on a factory test image.

FIG. 3 shows an exemplary sensor pixel circuit 300 applicable to each of the pixels in FIGS. 1 and 2. Circuit 300, a photodiode-type active sensor pixel circuit, includes photodiode 310, a source-follower field-effect transistor SF, a row-select field-effect transistor SL, and a charge-reset field-effect transistor RS. (An n-channel load transistor for source-follower transistor SF is not shown.) Each field-effect transistor has respective gate, drain, and source nodes. The circuit further includes an address line 320, a drain line 330, a reset line 340, and a signal line 350.

In operation, a voltage develops across photodiode 310 based on incident light. Application of appropriate control signals on the gate of transistor SL produces an image signal on signal line 350 based on the voltage across the photodiode. Signal line 350 couples the image signal to an input node of an analog-to-digital converter or summer, such as summer 210 in FIG. 2.

Various embodiments implement the photodetectors as passive or active photodiode circuits, as photogate circuits, as logarithmic sensor pixel circuits, or as charge-modulation devices. (See, for example, Eric R. Fossum, CMOS Image Sensors: Electronic Camera-On-A-Chip, 1995 International Electron Devices Meeting Digest of Technical Papers, which is incorporated herein by reference.) Some embodiments each photodetector occupies a surface area less than 30 square microns, such as 15 or 25 square microns. Some of these embodiments have a fill factor greater than 30 percent. Thus, the present invention is not limited to any particular photodetector circuit or class of photodetector circuits.

CONCLUSION

In furtherance of the art, the inventors have presented new imaging arrays and related methods for compensating for defective photodetectors. One exemplary embodiment of a new imaging array includes one or more group pixel circuits, each of which comprises two or more photodetectors that are substantially smaller than conventional photodetectors, for example about 15 or 25 square microns. Each group pixel circuit produces a single group image signal. The group image signal is then scaled or amplified to compensate for defective or malfunctioning photodetectors.

The embodiments described above are intended only to illustrate and teach one or more ways of practicing or implementing the present invention, not to restrict its breadth or scope. The scope of the invention intended to encompass all ways of practicing the principles of the invention, is defined only by the following claims and their equivalents.

What is claimed is:

1. An imaging system comprising:

two or more group pixels comprising two or more photodetector circuits for providing two or more corresponding pixel image signals, with each photodetector circuit having a surface area less than 50 square microns and comprising:
   a source-follower transistor have a gate, source, and drain;
   a ground node; and
   a photodiode coupled between the gate of the source-follower transistor and the ground node;
a summer responsive to two or more of the corresponding pixel image signals for outputting an aggregate image signal;
a variable-gain amplifier responsive to the aggregate image signal for outputting an amplified aggregate image signal based on an adjustable amplifier gain;
an automatic gain controller for adjusting the adjustable amplifier gain based on the aggregate image signal;
an address line; and
a signal line, with each photodetector circuit of one of the group pixels coupled to the address line and the signal line.

2. The imaging system of claim 1 wherein the summer comprises a digital summer.

3. The imaging system of claim 1 wherein the variable-gain amplifier is a digital amplifier.

4. The imaging system of claim 1, wherein each photodetector in the first group pixel is tuned to detect substantially the same color light.

5. The imaging system of claim 1, wherein the automatic gain controller adjusts the adjustable amplifier gain based on a number of faulty photodetectors in the one of the group pixels.

6. The imaging system of claim 1, wherein the automatic gain controller adjusts the adjustable amplifier gain based on a ratio of a total number of photodetectors in one of the group pixels to a total number of faulty photodetectors in the one of the group pixels.

7. An imaging system comprising:
a first group pixel comprising two or more photodetectors for providing two or more corresponding pixel image signals;
a second group pixel comprising two or more photodetectors for providing two or more corresponding pixel image signals;
a summer responsive to two or more of the corresponding pixel image signals for outputting an aggregate image signal;
a variable-gain amplifier responsive to the aggregate image signal for outputting an amplified aggregate image signal based on an adjustable amplifier gain;
an automatic gain controller for adjusting the adjustable amplifier gain based on the aggregate image signal;
an address line; and
a signal line, with each photodetector of the first group pixel coupled to the address line and the signal line, wherein each photodetector in the first group pixel is tuned to detect substantially the same color light.

8. The imaging system of claim 7 wherein the summer is digital.

9. The imaging system of claim 7 wherein the variable-gain amplifier is a digital amplifier.

10. The imaging system of claim 7, wherein the automatic gain controller adjusts the adjustable amplifier gain based on a number of photodetectors in one of the group pixels and a number of faulty photodetectors in the one of the group pixels.

11. The imaging system of claim 7, wherein the automatic gain controller adjusts the adjustable amplifier gain based on a ratio of a total number of photodetectors in one of the group pixels to a total number of faulty photodetectors in the one of the group pixels.

12. An imagine system comprising:
- two or more group pixels each comprising photodetection means for providing two or more corresponding pixel image signals;
- a summer responsive to two or more of the corresponding pixel image signals for outputting an aggregate image signal;
- a variable-gain amplifier responsive to the aggregate image signal for outputting an amplified aggregate image signal based on an adjustable amplifier gain;
- an automatic gain controller for adjusting the adjustable amplifier gain based on the amplified aggregate image signal;
- an address line; and
- a signal line, with each photodetection means of at least one of the group pixels coupled to the address line and the signal line and tuned to detect substantially the same color light.

13. The imaging system of claim 12 wherein the summer comprises a digital summer.

14. The imaging system of claim 12 wherein the variable-gain amplifier is a digital amplifier.

15. The imaging system of claim 12, wherein the automatic gain controller adjusts the adjustable amplifier gain based on a number of photodetectors in one of the group pixels and a number of faulty photodetectors in the one of the group pixels.

16. The imaging system of claim 12, wherein the automatic gain controller adjusts the adjustable amplifier gain based on a ratio of a total number of photodetectors in one of the group pixels to a total number of faulty photodetectors in the one of the group pixels.

17. An imaging system comprising:
- a first group pixel comprising two or more photodetectors for providing two or more corresponding pixel image signals;
- a second group pixel comprising two or more photodetectors for providing two or more corresponding pixel image signals;
- a summer responsive to two or more of the corresponding pixel image signals for outputting an aggregate image signal;
- a variable-gain amplifier responsive to the aggregate image signal for outputting an amplified aggregate image signal based on an adjustable amplifier pain;
- an automatic gain controller for adjusting the adjustable amplifier gain based on the aggregate image signal;
- an address line; and
- a signal line, with each photodetector of the first group pixel coupled to the address line and the signal line,
- wherein the summer is responsive to two or more of the corresponding pixel images signals from the first group pixel, and wherein the system further comprises:
  - another summer responsive to two or more of the corresponding pixel image signals from the second group pixel for outputting a second aggregate image signal;
  - another variable-gain amplifier responsive to the second aggregate image signal from the other summer for outputting another amplified aggregate image signal based on another adjustable amplifier gain; and
  - another automatic gain controller for adjusting the other adjustable amplifier gain based on the second amplified aggregate image signal.

18. The imaging system of claim 17 wherein the summer comprises a digital summer.

19. The imaging system of claim 17 wherein the variable-gain amplifier is a digital amplifier.

20. The imaging system of claim 17, wherein the automatic gain controller adjusts the adjustable amplifier gain based on a number of photodetectors in one of the group pixels and a number of faulty photodetectors in the one of the group pixels.

21. The imaging system of claim 17, wherein the automatic gain controller adjusts the adjustable amplifier gain based on a ratio of a total number of photodetectors in one of the group pixels to a total number of faulty photodetectors in the one of the group pixels.

* * * * *

UNITED STATES PATENT AND TRADEMARK OFFICE
CERTIFICATE OF CORRECTION

PATENT NO. : 6,756,576 B1
DATED : June 29, 2004
INVENTOR(S) : McElroy et al.

It is certified that error appears in the above-identified patent and that said Letters Patent is hereby corrected as shown below:

Column 2,
Line 28, delete "Line 130" and insert -- line 130 --, therefor.
Line 29, delete "or" and insert -- For --, therefor.

Column 4,
Line 1, after "practicing" insert -- or implementing --.
Line 12, delete "have" and insert -- having --, therefor.

Column 5,
Line 16, delete "imagine" and insert -- imaging --, therefor.

Column 6,
Line 13, delete "pain" and insert -- gain --, therefor.

Signed and Sealed this

Twenty-second Day of February, 2005

JON W. DUDAS
*Director of the United States Patent and Trademark Office*